(12) United States Patent
Sutardja

(10) Patent No.: US 6,836,182 B1
(45) Date of Patent: Dec. 28, 2004

(54) NESTED TRANSIMPEDANCE AMPLIFIER

(75) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/838,040

(22) Filed: May 3, 2004

Related U.S. Application Data

(63) Continuation of application No. 10/072,843, filed on Feb. 6, 2002, now Pat. No. 6,762,644.
(60) Provisional application No. 60/275,109, filed on Mar. 13, 2001.

(51) Int. Cl.[7] .................................................. H03F 3/45
(52) U.S. Cl. .................. 330/69; 360/77.02; 250/214 A; 330/98; 330/99; 330/100
(58) Field of Search .............................. 330/69, 98, 99, 330/100; 360/77.02; 250/214 A

(56) References Cited

U.S. PATENT DOCUMENTS

| | | | |
|---|---|---|---|
| 4,535,233 A | 8/1985 | Abraham | |
| 4,564,818 A | 1/1986 | Jones | |
| 4,724,315 A | 2/1988 | Goerne | |
| 4,764,732 A | 8/1988 | Dion | |
| 4,772,859 A | 9/1988 | Sakai | |
| 4,914,402 A | 4/1990 | Dermitzakis et al. | |
| 5,010,588 A | 4/1991 | Gimlett | |
| 5,345,073 A | 9/1994 | Chang et al. | |
| 5,382,920 A | 1/1995 | Jung | |
| 5,532,471 A | 7/1996 | Khorramabadi et al. | |
| 5,646,573 A | 7/1997 | Bayruns et al. | |
| 6,037,841 A | 3/2000 | Tanji et al. | |
| 6,057,738 A | 5/2000 | Ku et al. | |
| 6,084,478 A | 7/2000 | Mayampurath | |
| 6,114,913 A | 9/2000 | Entrikin | |
| 6,122,131 A | 9/2000 | Jeppson | |

FOREIGN PATENT DOCUMENTS

| | | |
|---|---|---|
| JP | H6-61752 | 3/1994 |
| JP | 406061752 A | 3/1994 |

OTHER PUBLICATIONS

Charles A. Holt, "Electronic Circuits Digital and Analog", by John Wiley & Sons, inc., 1978, pp. 423, 431, and 436.
You et al., SA 21.2 "A Multistate Amplifier Topology with Nested Gm–C Compensation for Low–Voltage Application", IEEE International Solid–State Circuits Conference, Digest of Technical Papers, ISSCC97, Feb. 8, 1997, pp. 348–349.

*Primary Examiner*—Michael B Shingleton

(57) ABSTRACT

A nested transimpedance amplifier (TIA) circuit includes a zero-order TIA having an input and an output. A first operational amplifier (opamp) has an input that communicates with the output of the zero-order TIA and an output. A first feedback resistor has one end that communicates with the input of the zero-order TIA and an opposite end that communicates with the output of the first opamp. A capacitor has one end that communicates with the input of the zero-order TIA. The gain-bandwidth product of the nested TIA is increased. Differential mode TIAs also have increased gain-bandwidth products.

36 Claims, 8 Drawing Sheets

US 6,836,182 B1

NESTED TRANSIMPEDANCE AMPLIFIER

CROSS-REFERENCE TO RELATED APPLICATIONS

This application is a continuation of U.S. patent application Ser. No. 10/072,843, filed on Feb. 6, 2002, now U.S. Pat. No. 6,762,644 which claims the benefit of U.S. Provisional Application No. 60/275,109, filed Mar. 13, 2001, both of which are hereby incorporated by reference in their entirety.

FIELD OF THE INVENTION

The present invention relates to transimpedance amplifiers, and more particularly to nested transimpedance amplifiers with an increased gain-bandwidth product.

BACKGROUND OF THE INVENTION

A transimpedance amplifier (TIA) is a well-known type of electronic circuit. Referring now to FIG. 1, a TIA 100 includes an operational amplifier (opamp) 105 having a gain parameter ($g_m$). The opamp 105 is connected in parallel to a resistor ($R_f$) 110. The input to the TIA 100 is a current ($\Delta i$) 115. The output of the TIA 100 is a voltage ($\Delta v_o$) 120.

Referring now to FIG. 2, the opamp 105 of the TIA 100 is replaced by a current source 205 and a transistor 210 having gain $g_m$. The TIA 100 in FIGS. 1 and 2 is often referred to as a transconductance amplifier because it converts the input current $\Delta i$ into the output voltage $\Delta v_o$.

Referring now to FIG. 3, a TIA 300 converts an input voltage ($\Delta v_i$) 305 into an output voltage ($\Delta v_o$) 310. The TIA 300 also includes a resistor 315 that is connected to a transistor 320. The TIA 300 is typically used in applications that require relatively low bandwidth.

Referring now to FIG. 4, a TIA 400 converts an input voltage ($\Delta v_i$) 405 into an output voltage ($\Delta v_o$) 410. The TIA 400 includes a second opamp 415, which is connected in series to a parallel combination of a resistor ($R_f$) 420 and an opamp 425. The TIA 400 is typically used for applications having higher bandwidth requirements than the TIA 300.

Ordinarily, the bandwidth of the TIA is limited to a fraction of a threshold frequency $f_T$ of transistor(s) that are used in the opamp(s). In the case of a bipolar junction transistor (BJT) such as a gallium-arsenide (GaAs) transistor, the bandwidth of the TIA is approximately equal to 10%–20% of $f_T$. For metal-oxide-semiconductor (MOS) transistor(s), the bandwidth of the TIA is typically a few percent (i.e., approximately 2%–6%) of $f_T$.

Referring now to FIG. 5, a TIA 500 may be configured to operate differentially using two inputs of each opamp 502 and 504. One input 505 acts as a reference, in a similar manner as ground or virtual ground in a standard configuration TIA. The input voltage $\Delta v_i$ and the output voltage $\Delta v_o$ are measured as voltage differences between a reference input 505 and a second input 510. Feedback resistors 514 and 516 are connected across the inputs and the outputs of the opamp 504.

Referring now to FIG. 6, one TIA application having a relatively high bandwidth requirement is that of an optical sensor. An optical sensor circuit 600 includes the opamp 105 and the resistor 110 of the TIA 100 that are coupled with a photodiode 605. The output of the photodiode 605 is a current $I_{photo}$ 610, which acts as an input to the TIA 100.

Increasingly, applications require both high bandwidth and high gain. Examples include optical sensors, such as fiber optic receivers, and preamplifier writers for high-speed hard disk drives. Efforts to increase the gain-bandwidth product of TIAs have been made. For example, in U.S. Pat. No. 6,114,913, which are hereby incorporated by reference, a boost current is used to increase the gain-bandwidth product in the TIA. Cascading TIA stages is also used in U.S. Pat. Nos. 5,345,073 and 4,772,859, which are hereby incorporated by reference.

Other improvements to TIAs are the subject of other patents, such as U.S. Pat. Nos. 6,084,478; 6,057,738; 6,037,841; 5,646,573; 5,532,471; 5,382,920; 5,010,588; 4,914,402; 4,764,732; 4,724,315; 4,564,818; and 4,535,233, which are hereby incorporated by reference. However, improving the gain-bandwidth product of TIAs continues to be a challenge for circuit designers.

SUMMARY OF THE INVENTION

A nested transimpedance amplifier (TIA) circuit according to the present invention includes a zero-order TIA having an input and an output. A first operational amplifier (opamp) has an input that communicates with the output of the zero-order TIA and an output. A first feedback resistance has one end that communicates with the input of the zero-order TIA and an opposite end that communicates with the output of the first opamp.

In other features, a capacitor has one end that communicates with the input of the zero-order TIA. The zero order TIA includes a second opamp having an input and an output. A third opamp has an input that communicates with the output of the second opamp and an output. A second feedback resistance has one end that communicates with the input of the third opamp and an opposite end that communicates with the output of the third opamp.

In yet other features, a fourth opamp has an input and an output that communicates with the input of the second opamp. A fifth opamp has an input that communicates with the output of the first opamp and an output. A third feedback resistance has one end that communicates with the input of the fourth opamp and an opposite end that communicates with the output of the fifth opamp.

In still other features, at least one higher order circuit is connected to the nested TIA circuit and includes an $n^{th}$ feedback resistance, an $n^{th}$ opamp, and an $(n+1)^{th}$ opamp.

In yet other features of the invention, a nested differential mode TIA circuit includes a zero-order differential mode TIA having first and second inputs and first and second outputs. A first differential mode opamp has first and second inputs that communicate with the first and second outputs of the zero-order differential mode TIA and first and second outputs. A first feedback resistance has one end that communicates with the first input of the zero-order differential mode TIA and an opposite end that communicates with the first output of the zero-order differential mode TIA. A second feedback resistance has one end that communicates with the second input of the zero-order differential mode TIA and an opposite end that communicates with the second output of the zero-order differential mode TIA.

In still other features, the zero order differential mode TIA includes a second differential mode opamp having first and second inputs and first and second outputs. A third differential mode opamp has first and second inputs that communicate with the first and second outputs of the second differential mode opamp and first and second outputs. A third feedback resistance has one end that communicates with the first input of the third differential mode opamp and an opposite end that communicates with the first output of the third differential mode opamp. A fourth feedback resistance has one end that communicates with the second input of the third differential mode opamp and an opposite end that communicates with the second output of the third differential mode opamp.

In still other features, at least one higher order circuit is connected to the nested TIA circuit and includes an $n^{th}$ feedback resistance, an $(n+1)^{th}$ feedback resistance, and an $n^{th}$ differential mode opamp.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

The present invention addresses the need for increasing the gain-bandwidth product of TIAs. Improvements in the gain-bandwidth product are achievable by "nesting" a TIA within another TIA. In other words, additional circuit elements such as feedback resistors, capacitors and/or opamps are added on the input and/or output sides of the TIA.

Figure 7:
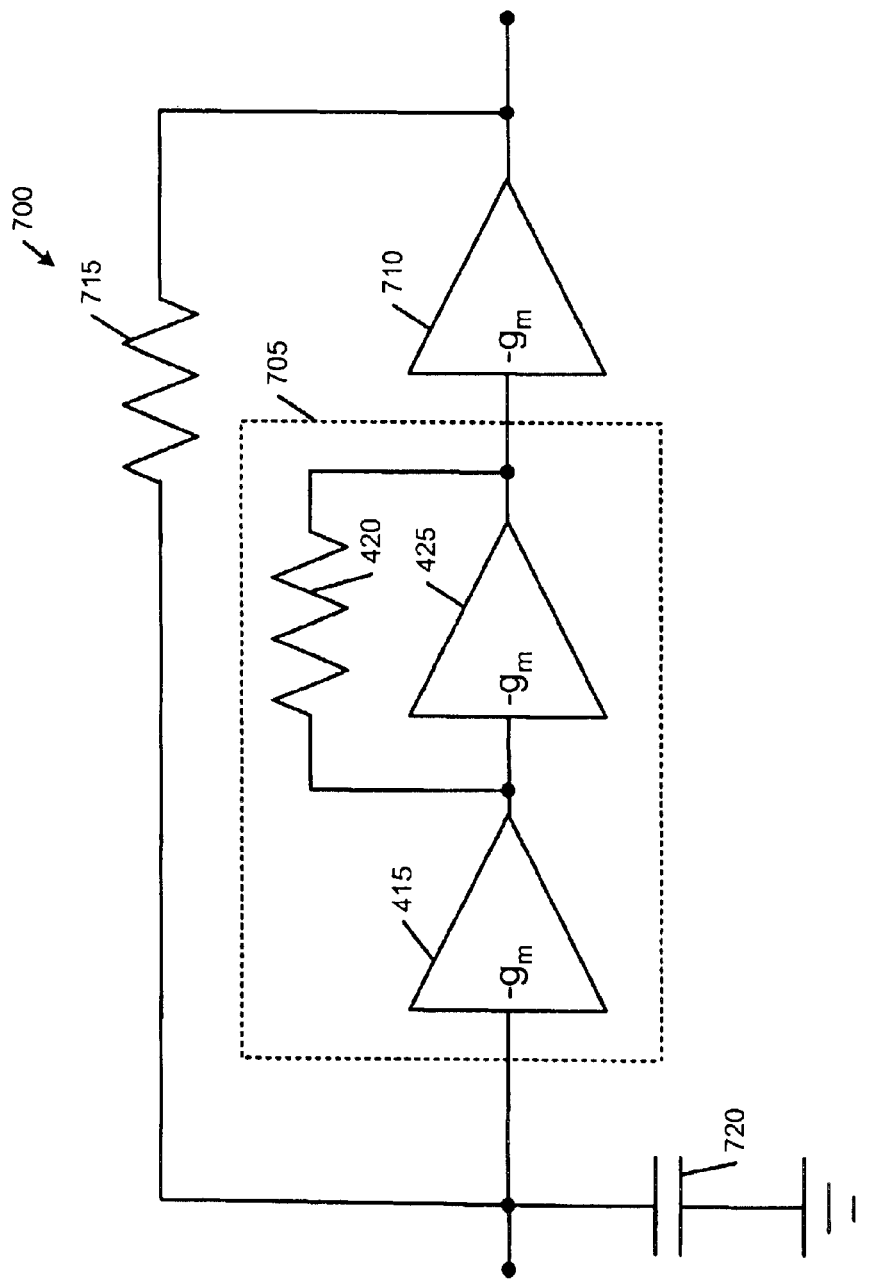
FIG. 7 is a first-order nested TIA according to the present invention.
Figure 8:
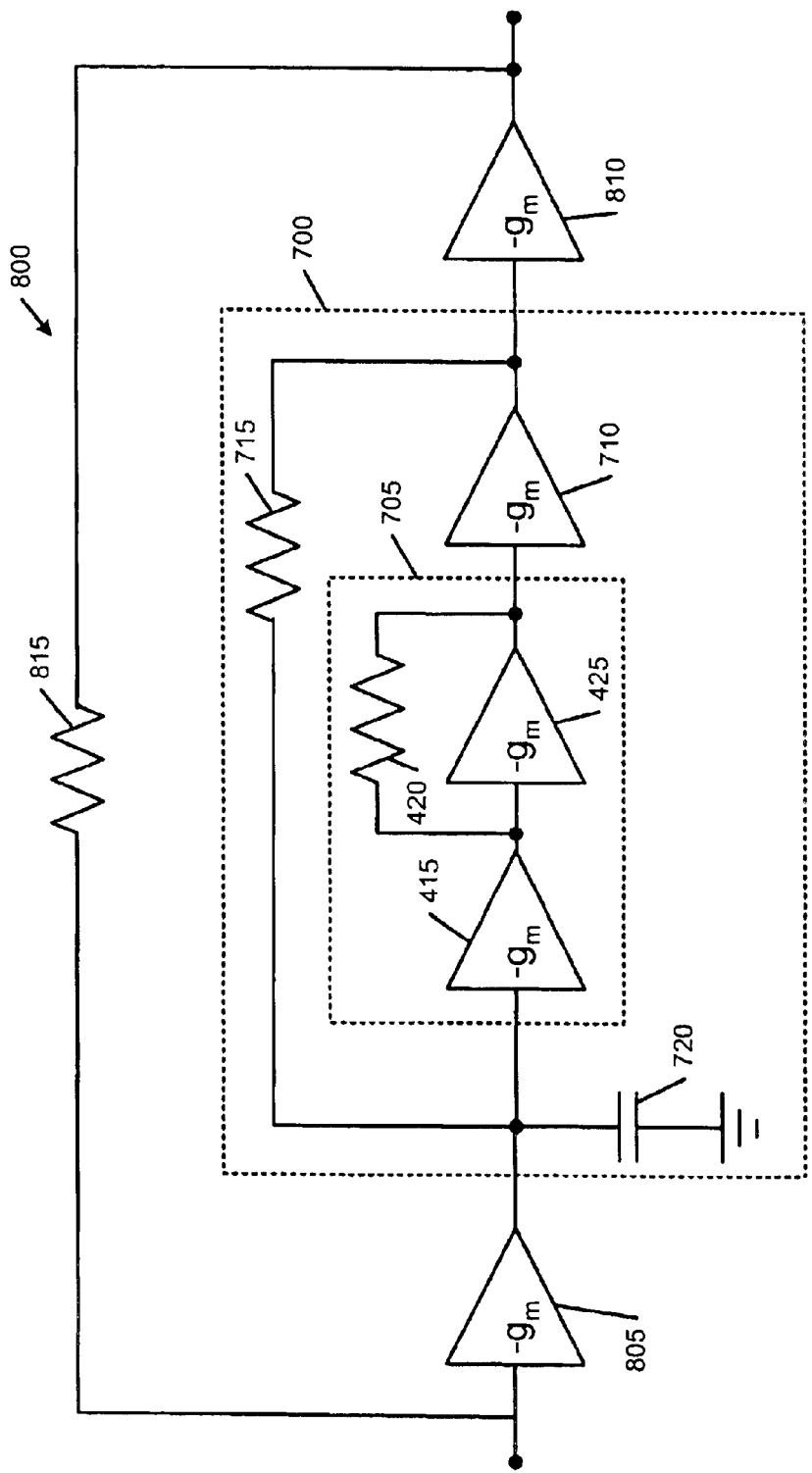
FIG. 8 is a second-order nested TIA according to the present invention.
Figure 9:
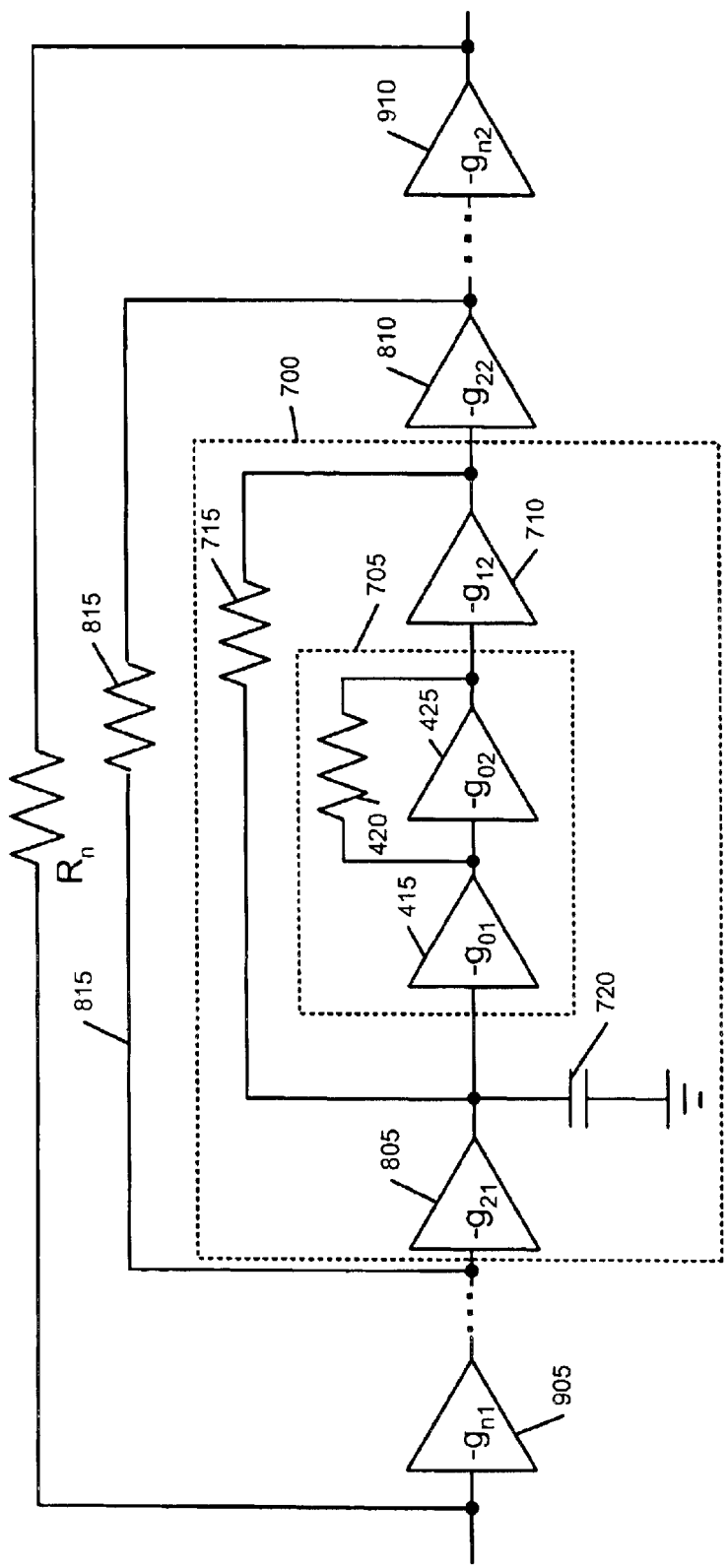
FIG. 9 is an nth-order nested TIA according to the present invention.
Figure 10:
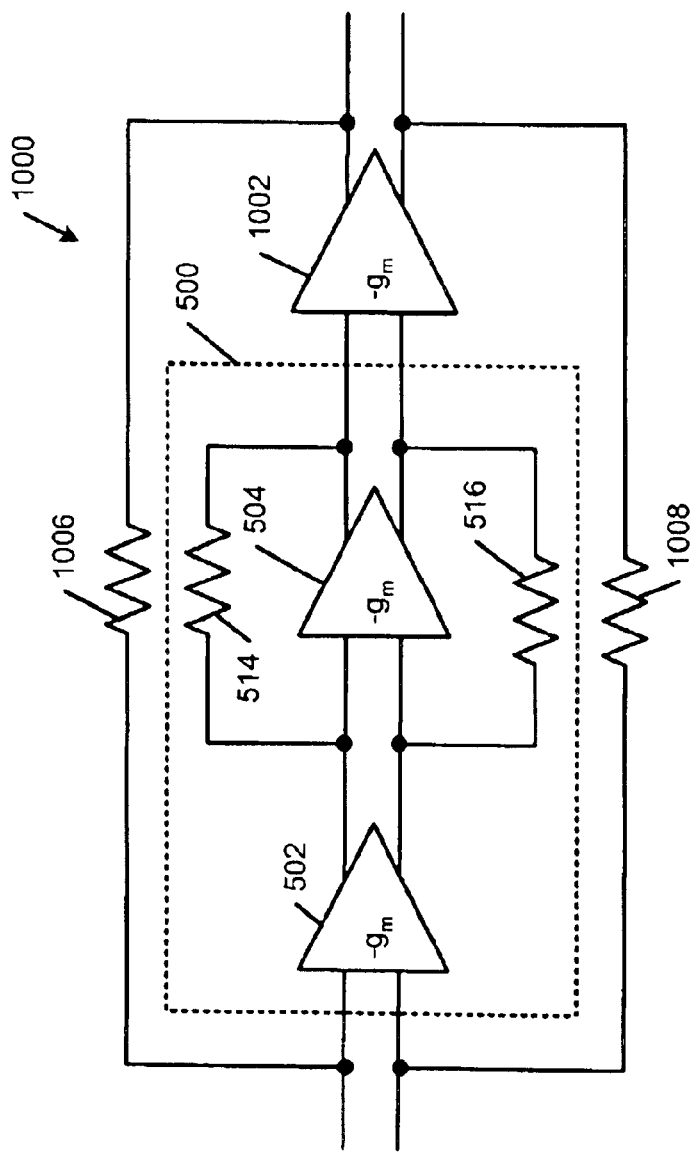
FIG. 10 is a first-order nested TIA in a differential configuration according to the present invention.
Figure 11:
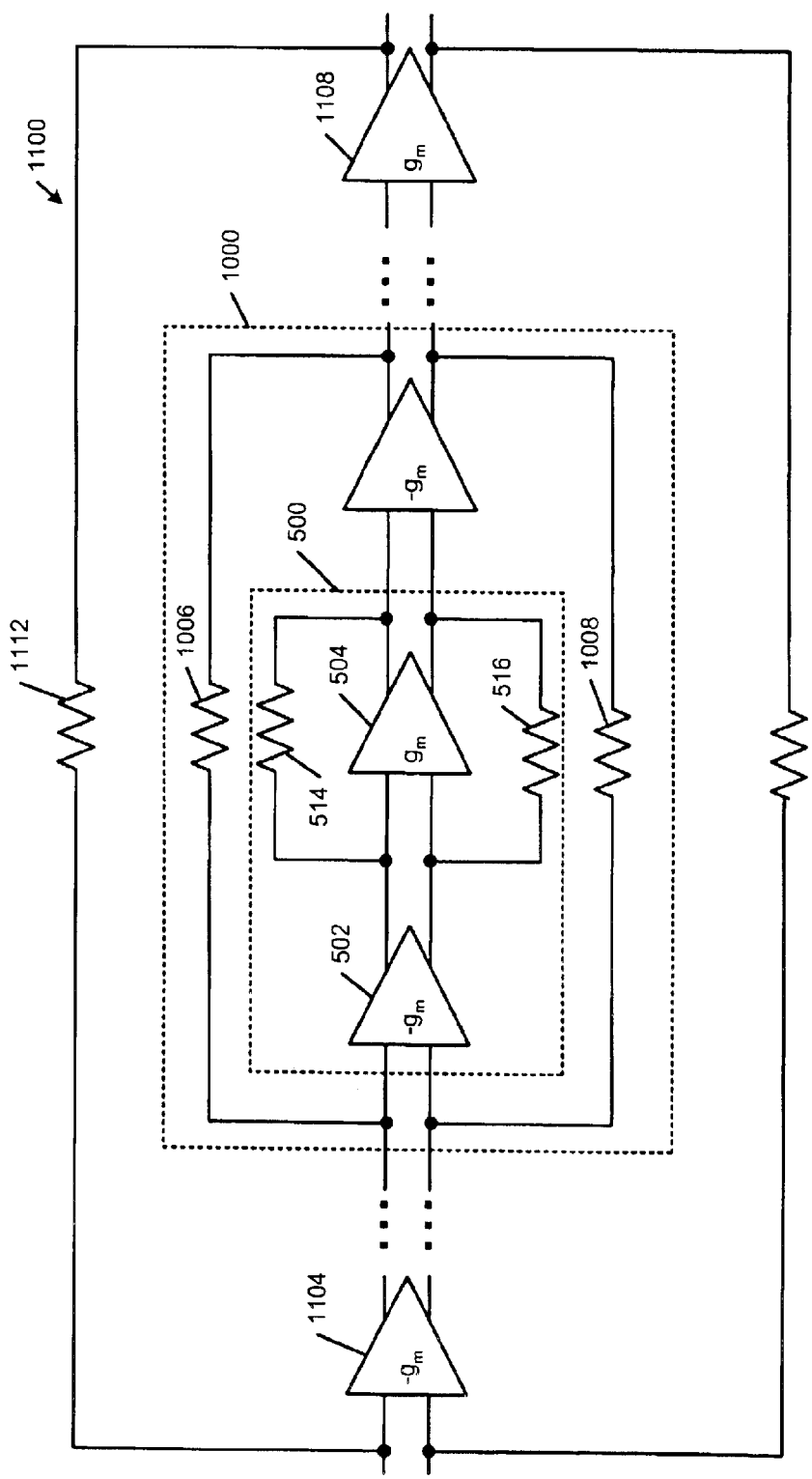
FIG. 11 is an nth-order nested TIA in a differential configuration according to the present invention.

Referring now to FIGS. 7, 8, and 9, a "nested" TIA is constructed by adding opamps, feedback resistors and/or capacitors to a zero-order TIA. In FIGS. 10 and 11, a nested TIA may also be constructed to operate in a differential mode.

Figure 1:
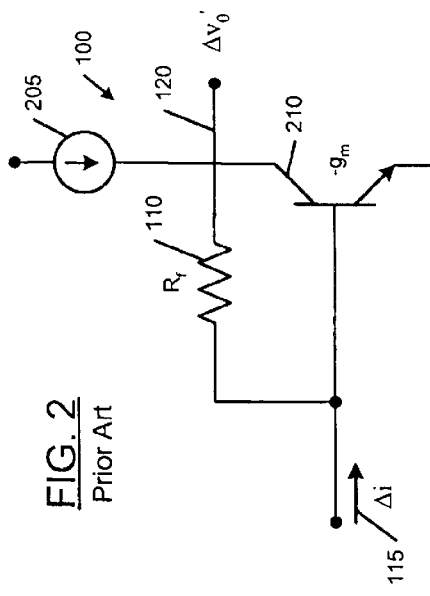
FIGS. 1 and 2 are basic circuit architectures for a current-to-voltage TIA according to the prior art.
Figure 2:
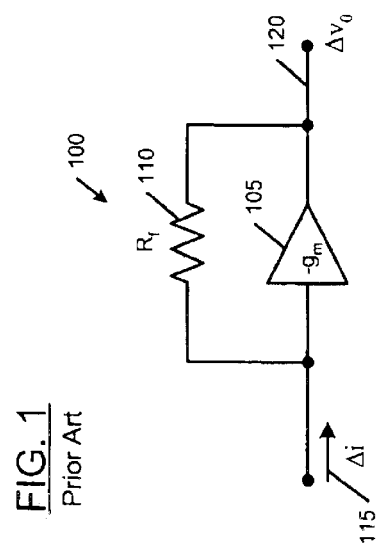
Figure 3:
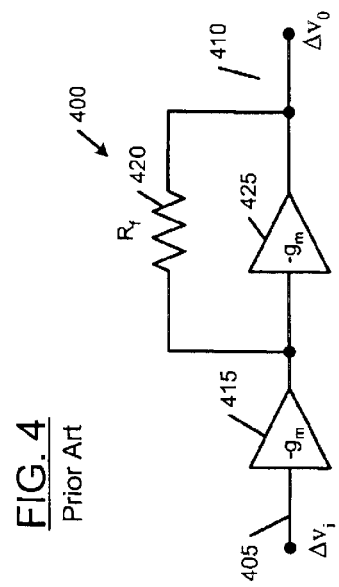
FIGS. 3 and 4 are basic circuit architectures for a voltage-to-voltage TIA according to the prior art.
Figure 4:
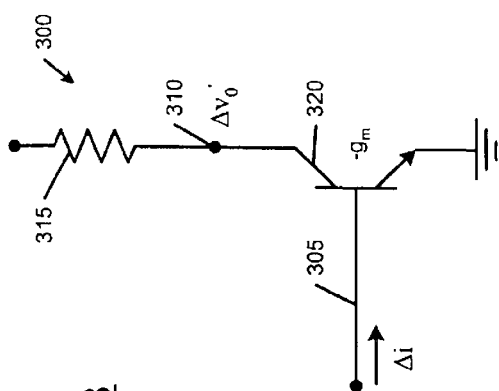
Figure 6:
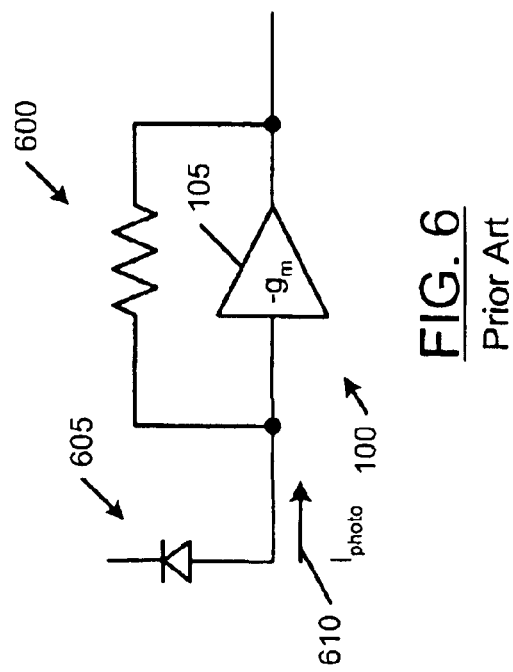
FIG. 6 shows an optical sensor, including a photodiode coupled to a TIA, according to the prior art.

Referring back to FIG. 7, a first-order nested TIA 700 is shown. Reference numbers from FIG. 4 are used in FIG. 7 to identify similar elements. The TIA 700 includes a conventional TIA 705 (also referred to herein as a "zero-order" TIA), an opamp 710, and a feedback resistor 715. The feedback resistor 715 may be a standard fixed-value resistor, a nonlinear variable resistor, or an MOS resistor. A capacitor 720 is also connected between an input of the TIA 700 and ground (or virtual ground).

By nesting the TIA in this manner, improvements in the gain-bandwidth product may be realized. For example, the first-order nested TIA 700 that uses MOS transistors may achieve a bandwidth that is 10%–20% of the threshold frequency $f_T$. This range represents a bandwidth that is approximately five to ten times greater than the bandwidth of the corresponding zero-order TIA.

Figure 12:
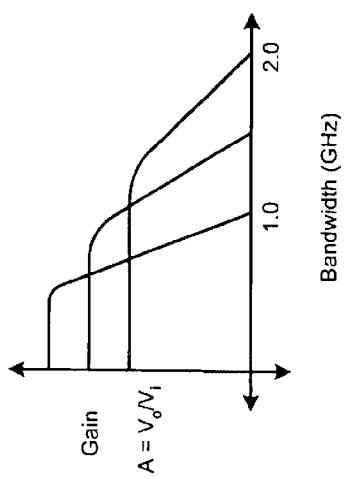
FIG. 12 is a graph of exemplary gain-bandwidth characteristics for a TIA.
Figure 13:
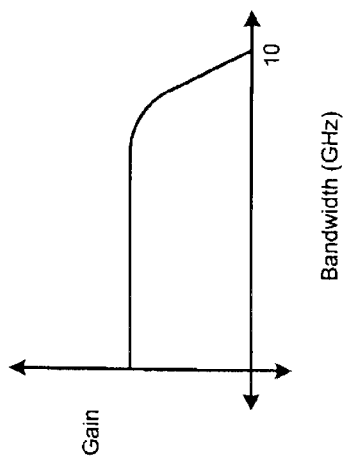
FIG. 13 is a graph of an exemplary gain-bandwidth characteristic for a first-order nested TIA.

Referring now to FIGS. 12 and 13, graphs illustrating characteristic gain-bandwidth curves for a zero-order TIA and a first-order nested TIA, respectively, are shown. In general, a higher value of gain is associated with a lower value of bandwidth, and a lower value of gain is associated with a higher value of bandwidth. The gain A, defined as the output voltage $\Delta v_o$ divided by the input voltage $\Delta v_i$, is typically on the order of a few hundred or a few thousand (i.e., approximately $10^2$–$10^3$). A typical range of threshold frequency ($f_T$) values for a 0.13 $\mu$m CMOS process is 30 GHz–40 GHz.

In FIG. 12, three exemplary characteristic curves are shown. A high gain value yields a bandwidth value of approximately 1 GHz. A medium gain value increases the bandwidth to approximately 2 GHz. Other values of gain and bandwidth are possible. For example, a TIA may have a characteristic gain value that is higher than the maximum shown in FIG. 12 and a bandwidth that is less than 1 GHz. A TIA may have a characteristic gain value that is lower than the minimum gain value shown in FIG. 12 and a bandwidth that is greater than 2 GHz. As can be appreciated, the bandwidth varies as an inverse function of gain. This function may be referred to as the "spread". The spread is greater for TIAs using MOS transistors than for TIAs using bipolar junction transistors (BJTs). Thus, the need to improve the TIA bandwidth performance is more pronounced with MOS transistors than with BJT transistors.

The exemplary bandwidth values shown in FIG. 12 do not define upper and lower bandwidth bounds. In many practical applications, bandwidths on the order of 1 GHz or 2 GHz are too low. Many applications, such as an OC192 fiber optic receiver, require bandwidths on the order of 10 GHz. Preamplifiers for high-speed hard disk drives also typically require bandwidths that are on the order of several GHz. Referring now to FIG. 13, a first-order nested TIA at a typical gain value may have a bandwidth of approximately 10 GHz.

Figure 14:
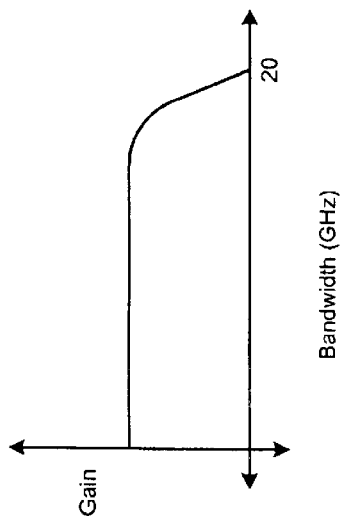
FIG. 14 is a graph of an exemplary gain-bandwidth characteristic for a second-order nested TIA.

Referring now to FIG. 8, a second-order nested TIA 800 builds upon the first-order nested TIA 700. Reference numbers from FIGS. 4 and 7 are used in FIG. 8 to identify similar elements. The second-order nested TIA 800 includes an opamp 805 at the input of the first-order nested TIA 700 and an opamp 810 at the output of the first-order nested TIA 700. An additional feedback resistor 815 is also added across the input of the opamp 805 and the output of the opamp 810. An exemplary gain-bandwidth curve that is produced using the second-order nested TIA 800 is shown in FIG. 14. For a typical gain value, a bandwidth of approximately 20 GHz may be achieved.

Referring now to FIG. 9, higher-order nested TIAs may be constructed by adding additional opamps and feedback resistors. Reference numbers from FIGS. 4, 7 and 8 are used in FIG. 9 to identify similar elements. For example, a third-order nested TIA 900 includes opamps 905 and 910 and feedback resistor 915. It is possible to achieve higher values of either gain or bandwidth (or both) by repeating the technique of the present invention. However, the efficiency of the circuit decreases as additional nesting levels are added due to parasitic noise and increased power dissipation. In general, either the first-order nested TIA or the second-order nested TIA will usually provide sufficient performance.

Figure 5:
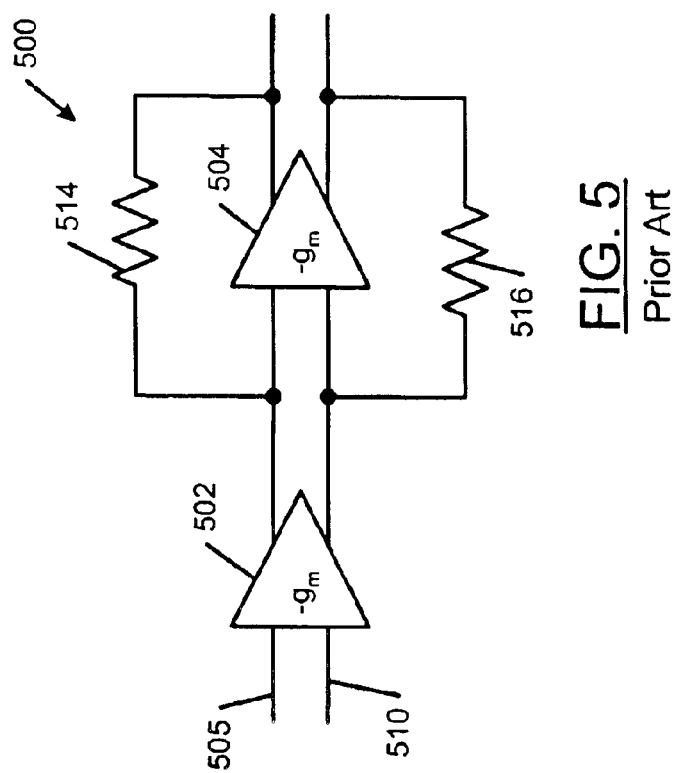
FIG. 5 is a basic circuit architecture for a differential configuration of a TIA according to the prior art.

Referring now to FIG. 10, a differential mode first-order nested TIA 1000 is shown. Reference numbers from FIG. 5 are used in FIG. 10 to identify similar elements. An opamp 1002 is connected to the outputs of the opamp 504. Feedback resistors 1006 and 1008 are connected to inputs of the differential mode TIA 500 and to outputs of the opamp 1002. The gain-bandwidth product of the TIA is increased.

Referring now to FIG. 11, a differential mode nth-order nested TIA 1100 is constructed in a manner that is similar to the nth-order nested TIA of FIG. 9. Reference numbers from FIGS. 5 and 10 are used in FIG. 11 to identify similar elements. Additional opamps 1104 and 1108 and feedback resistors 1112 are connected in a similar manner. The gain-bandwidth characteristics for differential mode TIAs are substantially similar to the gain-bandwidth characteristics shown in FIGS. 12-14.

It is noted that the opamps used in the nested TIA may employ either bipolar junction transistors (BJTs), such as gallium-arsenide (GaAs) transistors, or metal-oxide-semiconductor (MOS) transistors, such as CMOS or BIC-MOS transistors. The preferred embodiments of the invention use MOS transistors due to practical considerations such as ease of manufacture and better power consumption characteristics.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A nested transimpedance amplifier (TIA) circuit, comprising:
   a zero-order TIA having an input and an output;
   a first operational amplifier (opamp) having an input that communicates with said output of said zero-order TIA and an output;
   a first feedback resistance having one end that communicates with said input of said zero-order TIA and an opposite end that communicates with said output of said first opamp; and
   at least one higher order circuit that is connected to said nested TIA circuit and includes an $n^{th}$ feedback resistance, an $n^{th}$ opamp, and an $(n+1)^{th}$ opamp.

2. A nested differential mode TIA circuit, comprising:
   a zero-order differential mode TIA having first and second inputs and first and second outputs;
   a first differential mode opamp having first and second inputs that communicate with said first and second outputs of said zero-order differential mode TIA and first and second outputs;
   a first feedback resistance having one end that communicates with said first input of said zero-order differential mode TIA and an opposite end that communicates with said first output of said first differential mode opamp;
   a second feedback resistance having one end that communicates with said second input of said zero-order differential mode TIA and an opposite end that communicates with said second output of said first differential mode opamp; and
   at least one higher order circuit that is connected to said nested TIA circuit and includes an $n^{th}$ feedback resistance, an $(n+1)^{th}$ feedback resistance, and an $n^{th}$ differential mode opamp.

3. The nested TIA circuit of claim 1 further comprising a capacitor having one end that communicates with said input of said zero-order TIA.

4. The nested TIA circuit of claim 3 wherein said zero order TIA includes a second opamp having an input and an output and a third opamp having an input that communicates with said output of said second opamp and an output.

5. The nested TIA circuit of claim 4 wherein said zero order TIA includes a second feedback resistance having one end that communicates with said input of said third opamp and an opposite end that communicates with said output of said third opamp.

6. The nested TIA circuit of claim 5 further comprising a fourth opamp having an input and an output that communicates with said input of said second opamp.

7. The nested TIA circuit of claim 6 further comprising a fifth opamp having an input that communicates with said output of said first opamp and an output.

8. The nested TIA circuit of claim 7 further comprising a third feedback resistance having one end that communicates with said input of said fourth opamp and an opposite end that communicates with said output of said fifth opamp.

9. The nested TIA circuit of claim 1 wherein said first feedback resistance is one of a standard fixed-value resistor, a nonlinear variable resistor and a metal-oxide-semiconductor (MOS) resistor.

10. The nested TIA circuit of claim 1 wherein said first opamp includes one of bipolar junction transistors and metal-oxide-semiconductor transistors.

11. The nested TIA circuit of claim 1 wherein said first opamp includes metal-oxide-semiconductor transistors and a bandwidth of said nested TIA circuit is greater than 10% of a threshold frequency.

12. The nested TIA circuit of claim 1 wherein said nested TIA circuit is implemented in an optical sensor.

13. The nested TIA circuit of claim 1 wherein said nested TIA circuit is implemented in a preamplifier of a hard disk drive.

14. The nested differential mode TIA circuit of claim 2 wherein said zero order differential mode TIA includes a second differential mode opamp having first and second inputs and first and second outputs.

15. The nested differential mode TIA circuit of claim 14 wherein said zero order TIA includes a third differential mode opamp having first and second inputs that communicates with said first and second outputs of said second differential mode opamp and first and second outputs.

16. The nested differential mode TIA circuit of claim 15 wherein said zero order TIA includes a third feedback resistance having one end that communicates with said first input of said third differential mode opamp and an opposite end that communicates with said first output of said third differential mode opamp.

17. The nested TIA circuit of claim 2 wherein said first feedback resistance is one of a standard fixed-value resistor, a nonlinear variable resistor and a metal-oxide-semiconductor (MOS) resistor.

18. The nested TIA circuit of claim 2 wherein said first opamp includes one of bipolar junction transistors and metal-oxide-semiconductor transistors.

19. A nested transimpedance amplifier (TIA) circuit, comprising:
 a zero-order TIA having an input and an output;
 a first transconductance having an input that communicates with said output of said zero-order TIA and an output;
 a first feedback resistance having one end that communicates with said input of said zero-order TIA and an opposite end that communicates with said output of said first transconductance; and
 at least one higher order circuit that is connected to said nested TIA circuit and includes an $n^{th}$ feedback resistance, an $n^{th}$ transconductance, and an $(n+1)^{th}$ transconductance.

20. The nested TIA circuit of claim 19 further comprising a capacitor having one end that communicates with said input of said zero-order TIA.

21. The nested TIA circuit of claim 20 wherein said zero order TIA includes a second transconductance having an input and an output and a third transconductance having an input that communicates with said output of said second transconductance and an output.

22. The nested TIA circuit of claim 21 wherein said zero order TIA includes a second feedback resistance having one end that communicates with said input of said third transconductance and an opposite end that communicates with said output of said third transconductance.

23. The nested TIA circuit of claim 22 further comprising a fourth transconductance having an input and an output that communicates with said input of said second transconductance.

24. The nested TIA circuit of claim 23 further comprising a fifth transconductance having an input that communicates with said output of said first transconductance and an output.

25. The nested TIA circuit of claim 24 further comprising a third feedback resistance having one end that communicates with said input of said fourth transconductance and an opposite end that communicates with said output of said fifth transconductance.

26. The nested TIA circuit of claim 19 wherein said first feedback resistance is one of a standard fixed-value resistor, a nonlinear variable resistor and a metal-oxide-semiconductor (MOS) resistor.

27. The nested TIA circuit of claim 19 wherein said first transconductance includes one of bipolar junction transistors and metal-oxide-semiconductor transistors.

28. The nested TIA circuit of claim 19 wherein said first transconductance includes metal-oxide-semiconductor transistors and a bandwidth of said nested TIA circuit is greater than 10% of a threshold frequency.

29. The nested TIA circuit of claim 19 wherein said nested TIA circuit is implemented in an optical sensor.

30. The nested TIA circuit of claim 19 wherein said nested TIA circuit is implemented in a preamplifier of a hard disk drive.

31. A nested differential mode TIA circuit, comprising:
 a zero-order differential mode TIA having first and second inputs and first and second outputs;
 a first differential mode transconductance having first and second inputs that communicate with said first and second outputs of said zero-order differential mode TIA and first and second outputs;
 a first feedback resistance having one end that communicates with said first input of said zero-order differential mode TIA and an opposite end that communicates with said first output of said first differential mode transconductance;
 a second feedback resistance having one end that communicates with said second input of said zero-order differential mode TIA and an opposite end that communicates with said second output of said first differential mode transconductance; and
 at least one higher order circuit that is connected to said nested TIA circuit and includes an $n^{th}$ feedback resistance, an $(n+1)^{th}$ feedback resistance, and an $n^{th}$ differential mode transconductance.

32. The nested differential mode TIA circuit of claim 31 wherein said zero order differential mode TIA includes a second differential mode transconductance having first and second inputs and first and second outputs.

33. The nested differential mode TIA circuit of claim 32 wherein said zero order TIA includes a third differential mode transconductance having first and second inputs that communicates with said first and second outputs of said second differential mode transconductance and first and second outputs.

34. The nested differential mode TIA circuit of claim 33 wherein said zero order TIA includes a third feedback resistance having one end that communicates with said first input of said third differential mode transconductance and an opposite end that communicates with said first output of said third differential mode transconductance.

35. The nested TIA circuit of claim 31 wherein said first feedback resistance is one of a standard fixed-value resistor, a nonlinear variable resistor and a metal-oxide-semiconductor (MOS) resistor.

36. The nested TIA circuit of claim 31 wherein said first transconductance includes one of bipolar junction transistors and metal-oxide-semiconductor transistors.

* * * * *